United States Patent
Kang (10) Patent No.: US 9,577,660 B1
(45) Date of Patent: Feb. 21, 2017

(54) SUCCESSIVE APPROXIMATION ADC AND CONTROL METHOD THEREOF

(71) Applicant: Airoha Technology Corp., Hsinchu (TW)

(72) Inventor: Yu-Hsuan Kang, Hsinchu (TW)

(73) Assignee: AIROHA TECHNOLOGY CORP., Hsinchu (TW)

(*) Notice: Subject to any disclaimer, the term of this patent is extended or adjusted under 35 U.S.C. 154(b) by 0 days.

(21) Appl. No.: 15/239,920

(22) Filed: Aug. 18, 2016

(30) Foreign Application Priority Data

Nov. 13, 2015 (TW) .............................. 104137578 A (51) Int. Cl.
H03M 1/34 (2006.01)
H03M 1/46 (2006.01)
H03M 1/12 (2006.01)

(52) U.S. Cl.
CPC ............. *H03M 1/46* (2013.01); *H03M 1/1245* (2013.01)

(58) Field of Classification Search
CPC ........ H03M 1/462; H03M 1/125; H03M 1/12; H03M 1/46; H03M 1/1245
USPC ............... 341/163, 155, 144, 120, 142, 161, 122, 341/114
See application file for complete search history.

(56) References Cited

U.S. PATENT DOCUMENTS

| | | | | |
|---|---|---|---|---|
| 8,344,925 | B1 * | 1/2013 | Evans | H03M 1/462 341/118 |
| 2012/0176261 | A1 * | 7/2012 | Ishioka | H03M 1/1014 341/123 |
| 2014/0022105 | A1 | 1/2014 | Chen et al. | |
| 2016/0079994 | A1 * | 3/2016 | Lee | H03M 1/002 341/118 |

OTHER PUBLICATIONS

Liu, et al.: "A 10-bit 50-MS/s SAR ADC With a Monotonic Capacitor Switching Procedure"; IEEE Journal of Solid State Circuits, vol. 45, No. 4, Apr. 2010; pp. 731-740.

* cited by examiner

*Primary Examiner* — Peguy Jean Pierre
(74) *Attorney, Agent, or Firm* — McClure, Qualey & Rodack, LLP (57) ABSTRACT

Successive approximation ADC includes a digital-to-analog converter, a comparator, a comparison unit, a timing unit and a control logic circuit. The digital-to-analog converter converts a digital signal to a reference analog signal. The comparator compares an analog input signal with a reference analog voltage and generates a comparing signal. The comparison unit generates a comparison result signal according to the comparing signal. The timing unit generates a clock signal, and sequentially enables N supplementary clock signals corresponding to N bits when the comparison result signal is enabled. The control logic circuit updates the digital signal according to the comparing signal, and generates N bits of digital value sequentially from the most significant bit to the least significant bit, and then determines whether the digital value is valid according to whether the $N^{th}$ supplementary clock signal corresponding to the least significant bit is enabled.

13 Claims, 5 Drawing Sheets

SUCCESSIVE APPROXIMATION ADC AND CONTROL METHOD THEREOF

This application claims the benefit of Taiwan application Serial No. 104137578, filed Nov. 13, 2015, the present disclosure of which is incorporated by reference herein in its entirety.

TECHNICAL FIELD

The disclosure relates in general to a successive approximation analog-to-digital converter (ADC) and a control method thereof.

BACKGROUND

The current successive approximation analog-to-digital converter (ADC) converts an analog signal into an N-bit digital signal using a binary search. The successive approximation ADC includes a comparator. In order to convert an analog signal into an N-bit digital signal, the comparator will execute N times of comparison, and each time of comparison will generate one bit of the digital signal. After N times of comparison are completed, the N bits of the digital signal will be generated sequentially from the most significant bit to the least significant bit. However, when the comparison of one particular bit is very close, a longer time will be required to interpret the comparison result, and then a metastability state may occur. Since the successive approximation ADC in the metastability state may have inaccurate interpretation of the bit or may not have sufficient time to interpret the following bits, the N-bit digital signal converted by the successive approximation ADC may have remarkable error. Therefore, it has become a prominent task for the industries to provide a method for determining the validity of the N-bit digital signal and avoiding the occurrence of metastability state which may cause errors.

SUMMARY

According to one embodiment of the disclosure, a successive approximation analog-to-digital (ADC) is provided. The successive approximation ADC includes a digital-to-analog converter, a comparator, a comparison unit, a timing unit and a control logic circuit. The digital-to-analog converter converts a digital signal to a reference analog voltage. The comparator compares the magnitude of the analog input signal with that of the reference analog voltage and correspondingly generates a comparing signal under the control of a clock signal. The comparison unit generates a comparison result signal according to the comparing signal. The comparison result signal is enabled when the comparator completes comparison. The timing unit generates a clock signal, and sequentially enables the N supplementary clock signals corresponding to the N bits when the comparison result signal is enabled. The control logic circuit updates the digital signal according to the comparing signal when the comparison result signal is enabled, such that the comparator correspondingly updates the comparing signal. The control logic circuit further correspondingly updates the comparison result signal according to the updated comparing signal repetitively to sequentially enable the N supplementary clock signals. The control logic circuit further generates the N-bit digital value sequentially from the most significant bit to the least significant bit according to the updated comparing signal and the N enabled supplementary clock signals, and further determines whether the digital value is valid according to whether the $N^{th}$ supplementary clock signal corresponding to the least significant bit is enabled.

According to another embodiment of the disclosure, a control method of successive approximation ADC is provided. The successive approximation ADC converts an analog input signal to an N-bit digital value, and N is a positive integer greater than 1. The control method includes following steps. Firstly, a digital signal is converted to a reference analog voltage. Next, under the control of a clock signal, the magnitude of the analog input signal is compared with that of the reference analog voltage and a comparing signal is correspondingly generated. Then, a comparison result signal is generated according to the comparing signal, and is enabled when the comparator completes comparison. Then, a clock signal is generated, and N supplementary clock signals corresponding to the N bits are enabled sequentially when the comparison result signal is enabled. Then, the digital signal is updated according to the comparing signal when the comparison result signal is enabled, and the comparing signal is correspondingly updated by the comparator, and then the comparison result signal is correspondingly updated according to the updated comparing signal repetitively to sequentially enable the N supplementary clock signals. Then, an N-bit digital value is further generated sequentially from the most significant bit to the least significant bit according to the updated comparing signal and the N enabled supplementary clock signals. Lastly, whether the digital value is valid is determined according to whether the $N^{th}$ supplementary clock signal corresponding to the least significant bit is enabled.

The above and other aspects of the invention will become better understood with regard to the following detailed description of the preferred but non-limiting embodiment (s). The following description is made with reference to the accompanying drawings.

DETAILED DESCRIPTION

Figure 1:
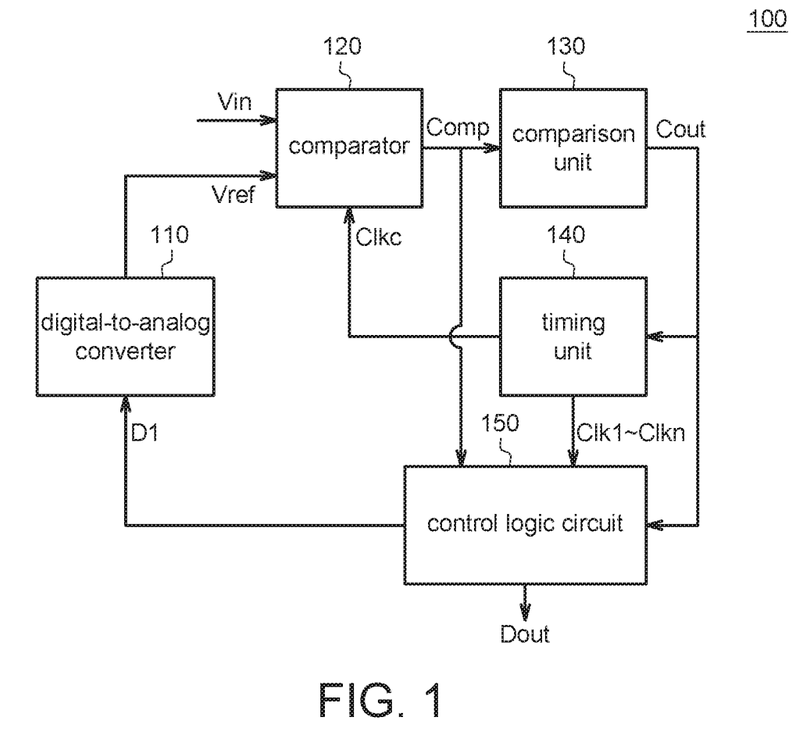
FIG. 1 is a block diagram of successive approximation ADC according to a first embodiment of the present disclosure.
Figure 2:
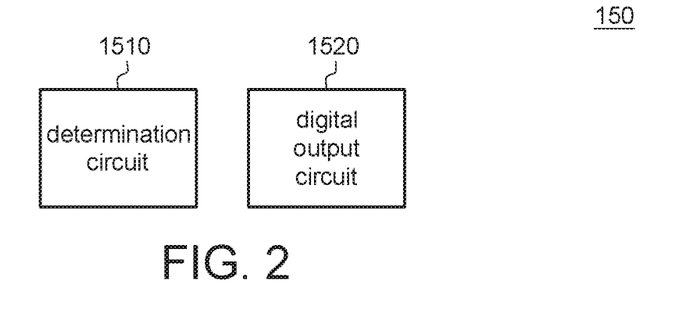
FIG. 2 is a block diagram of the control logic circuit of FIG. 1.

FIG. 1 is a block diagram of successive approximation ADC according to a first embodiment of the present disclosure. The successive approximation ADC 100 includes a digital-to-analog converter 110, a comparator 120, a comparison unit 130, a timing unit 140 and a control logic circuit 150. The digital-to-analog converter 110 converts a digital signal D1 to a reference analog voltage Vref. The comparator 120, under the control of a clock signal Clkc, compares the magnitude of the analog input signal Vin with that of the reference analog voltage Vref and correspondingly generates a comparing signal Comp. The comparison unit 130 generates a comparison result signal Cout according to the comparing signal Comp. The comparison result signal Cout is enabled when the comparator 120 completes comparison. The timing unit 140 generates the clock signal Clkc, and sequentially enables the N supplementary clock signals Clk1-Clkn corresponding to the N bits when the comparison result signal Cout is enabled. Both N and n are a positive integer greater than 1. When the comparison result signal Cout is enabled, the control logic circuit 150 updates the digital signal D1 according to the comparing signal Comp, such that the comparator 120 correspondingly updates the comparing signal Comp. The control logic circuit 150 correspondingly updates the comparison result signal Cout according to the updated comparing signal Comp repetitively to sequentially enable the N supplementary clock signals Clk1-Clkn. The control logic circuit 150 further generates a N-bit digital value Dout sequentially from the most significant bit to the least significant bit according to the updated comparing signal Comp and the N enabled supplementary clock signals Clk1-Clkn, and further determines whether the digital value Dout is valid according to whether the $N^{th}$ supplementary clock signal corresponding to the least significant bit Clkn is enabled. In the present embodiment, a method and a device for determining the validity of the digital value are provided. Referring to FIG. 2, a block diagram of the control logic circuit 150 of FIG. 1 is shown. The control logic circuit 150 includes a determination circuit 1510 and a digital output circuit 1520. The determination circuit 1510 determines whether the digital value Dout is valid according to whether the $N^{th}$ supplementary clock signal corresponding to the least significant bit Clkn is enabled. The digital output circuit 1520 generates an N-bit digital value Dout sequentially from the most significant bit to the least significant bit according to the updated comparing signal Comp and the N enabled supplementary clock signals. The digital output circuit 1520 can be realized by N D-type flip-flops. The N D-type flip-flops receive N comparing signals Comp, which are activated by the N enabled supplementary clock signals to generate N bits of the digital value Dout respectively.

Figure 3A:
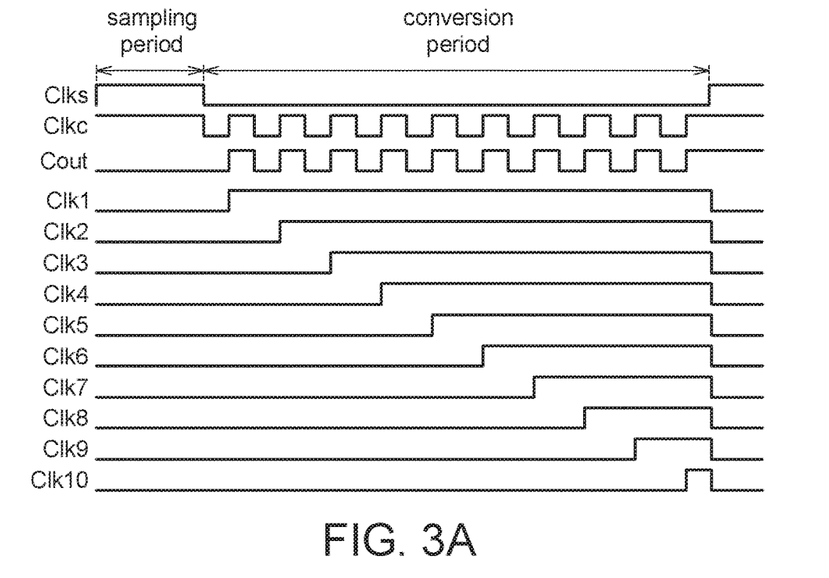
FIG. 3A is a timing diagram of a successive approximation ADC according to a first embodiment of the present disclosure.

Detailed descriptions of the successive approximation ADC are exemplified by a successive approximation ADC converting an analog input signal Vin into a 10-bit digital value. Referring to FIG. 3A, a timing diagram of a successive approximation ADC according to a first embodiment of the present disclosure is shown. During a sampling period, a sampling clock Clks is in an enable state, such that the successive approximation ADC 100 samples an analog input signal Vin. During a conversion period, the comparator 120, under the control of the clock signal Clkc, compares the magnitude of the analog input signal Vin with that of the reference analog voltage Vref converted from the 10-bit digital value and correspondingly generates a comparing signal Comp. The comparing signal Comp indicates the relationship between the magnitude of the analog input signal Vin and that of the reference analog voltage Vref. For example, the comparing signal Comp being equivalent to 1 indicates that the analog input signal Vin is greater than the reference analog voltage Vref, and the comparing signal Comp being equivalent to 0 indicates that the analog input signal Vin is smaller than the reference analog voltage Vref. However, the present disclosure is not limited thereto, and the comparing signal Comp can have other forms of indication. For example, the relationship between the magnitude of the analog input signal Vin and that of the reference analog voltage Vref can be indicated using more than 2 bits. In the present embodiment, firstly, the successive approximation ADC updates a digital value D1 using a binary search. Then, the comparator 120 performs comparison on the updated digital value D1 and updates the comparing signal Comp. In order to convert the analog input signal Vin into a 10-bit digital value, the comparison step will be executed for 10 times. At each time of comparison, the comparing signal Comp is outputted to the control logic circuit 150 to decide one bit of the digital value Dout. After the comparison step is executed for 10 times, a 10-bit digital value Dout can be generated sequentially from the most significant bit to the least significant bit.

When the comparator 120 completes comparison, the comparison unit 130 enables the comparison result signal Cout according to the comparing signal Comp. The comparison result signal Cout indicates whether the comparator 120 completes comparison. The comparison result signal Cout updates the digital value Dout used in next comparison when the comparison result signal Cout is enabled, that is, when the comparator 120 completes comparison. As indicated in FIG. 3A, the timing unit 140 sequentially enables the 10 supplementary clock signals Clk1-Clk10 corresponding to the 10 bits when the comparison result signal Cout is enabled. The 10 supplementary clock signals Clk1-Clk10 make the control logic circuit 150 generate a 10-bit digital value Dout.

Figure 3B:
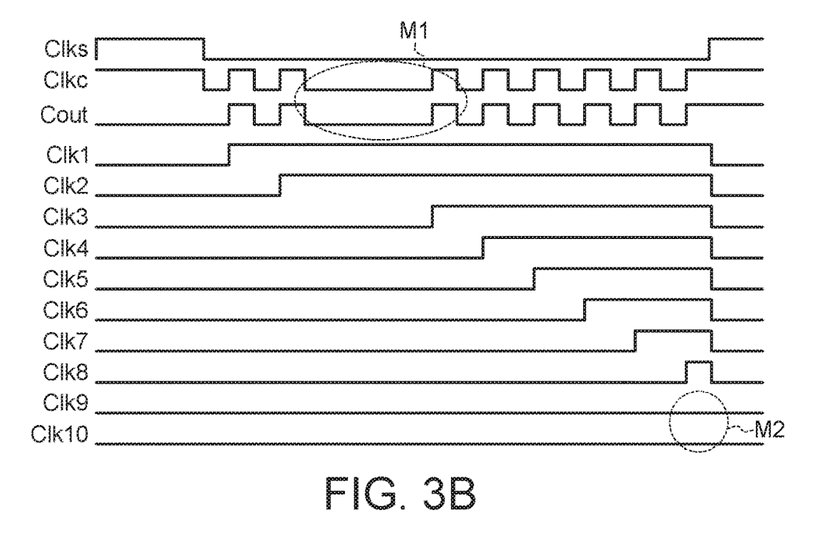
FIG. 3B is a timing diagram of a successive approximation ADC in a metastability state.

In some embodiments, during comparison, the comparator 120 may spend a period of time determining the relationship between the analog input signal Vin and the reference analog voltage Vref. If the comparator 120 is unable to determine the relationship, a metastability state will occur. FIG. 3B is a timing diagram of a successive approximation ADC in a metastability state. As indicated in FIG. 3B, during the $3^{rd}$ time of comparison (represented by M1), it takes a longer time to generate the comparison result signal Cout. In the example of FIG. 3B, since the time is delayed in the $3^{rd}$ time of comparison, there is no sufficient time to execute the $9^{th}$ and the $10^{th}$ times of comparison (represented by M2), and the values of the $9^{th}$ and the $10^{th}$ bits cannot be determined or can only be set to default values (such as 00 or 11). Moreover, since the $3^{rd}$ time of comparison takes a longer time to generate the comparing signal, this implies that the comparison results of the $3^{rd}$ bit are very close. When the successive approximation ADC is in a metastability state, the above two scenarios M1 and M2 may occur, and the eventually generated 10-bit digital value Dout may be inaccurate. For example, the errors between 1011111111 and 1001111111 are huge. Thus, the present disclosure can determine whether the digital value Dout is valid according to whether the $N^{th}$ supplementary clock signal corresponding to the least significant bit Clkn is enabled.

Figure 4:
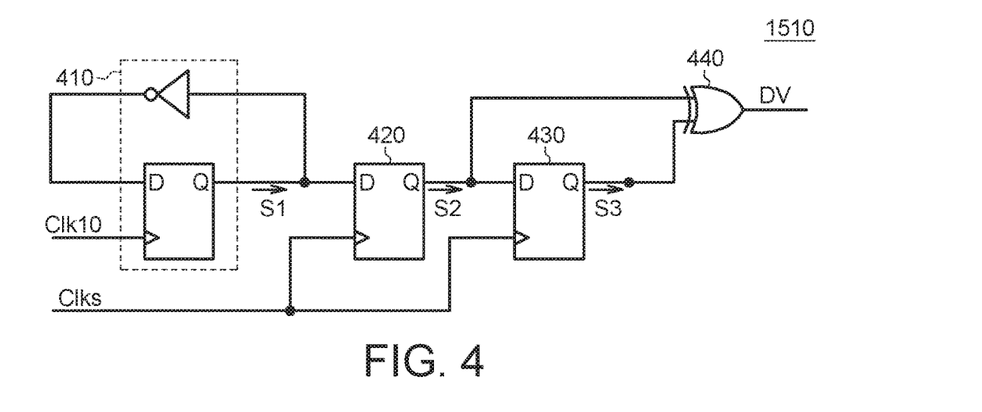
FIG. 4 is an example of a block diagram of the determination circuit of FIG. 2.

The device for determining whether the $N^{th}$ supplementary clock signal Clkn is enabled is exemplified below. Referring to FIG. 4, an example of a block diagram of the determination circuit 1510 of FIG. 2 is shown. In the present embodiment, the determination circuit 1510 includes a divider 410, a sampling circuit 420, a delay sampling circuit 430 and an XOR gate 440. In the present embodiment, the divider 410, the sampling circuit 420, and the delay sampling circuit 430 are realized by D-type flip-flops, but the present disclosure is not limited thereto. The divider 410 receives a supplementary clock signal Clk10 corresponding to the $10^{th}$ bit to generate a first signal S1. The sampling circuit 420 receives the first signal S1, and generates a first sampling signal S2 under the control of the sampling clock signal Clks. The delay sampling circuit 430 receives the first sampling signal S2, and delays the first sampling signal S2 to generate a second sampling signal S3 under the control of the sampling clock signal Clks. The XOR gate 440 receives the first sampling signal S2 and the second sampling signal S3 to generate a data validity signal DV to determine whether the supplementary clock signal Clk10 corresponding to the $10^{th}$ bit (the least significant bit) is enabled, but the present disclosure is not limited thereto. Based on actual situation, whether the digital value corresponding to a particular bit is valid can be determined by detecting the supplementary clock signal corresponding to the particular bit.

Figure 5:
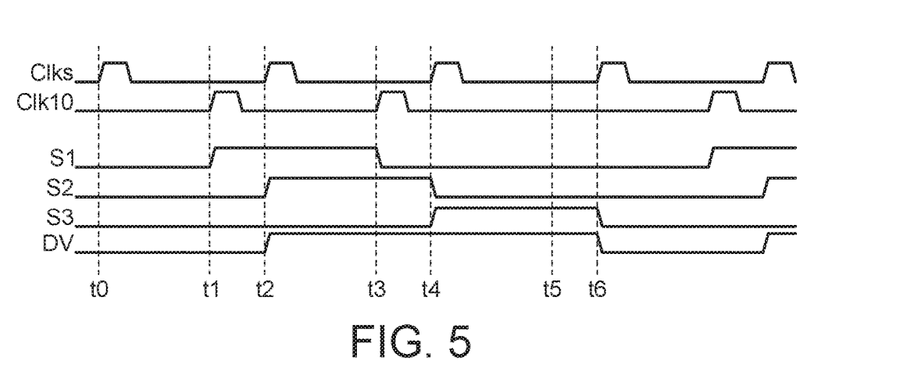
FIG. 5 is a timing diagram of the determination circuit of FIG. 4.

Referring to FIG. 5, a timing diagram of the determination circuit 1510 of FIG. 4 is shown. FIG. 5 illustrates the operation of the determination circuit 1510 of FIG. 4. Firstly, at time point t0, the sampling clock Clks is enabled to enter a sampling period of the successive approximation ADC 100. Then, and the enabled sampling clock Clks enters a conversion period to generate a 10-bit digital value Dout sequentially from the most significant bit to the least significant bit according to the comparing signal Comp and the 10 enabled supplementary clock signals. At time point t1, the supplementary clock signal Clk10 corresponding to the $10^{th}$ bit (the least significant bit) is enabled; meanwhile, the divider 410 is activated to output an enabled first signal S1. At time point t2, the sampling clock Clks is again enabled to execute the operation of the successive approximation ADC 100 in the next cycle; meanwhile, the sampling circuit 420 is activated to output a first sampling signal S2 whose level the same as that of the first signal S1, that is, the first sampling signal S2 is also enabled. At time point t3, the supplementary clock signal Clk10 corresponding to the $10^{th}$ bit (the least significant bit) is also enabled; meanwhile, the divider 410 is activated. Since the first signal S1 received at the input end of the D-type flip-flop of the divider 410 is fed backed by an inverter and has a disable level, the first signal S1 is disabled at time point t3. At time point t4, the sampling clock Clks is also enabled to execute the operation of the successive approximation ADC 100 in the next cycle; meanwhile, the sampling circuit 420 is activated to output a first sampling signal S2 whose level is the same as that of the first signal. That is, the first sampling signal S2 changes to a disable state. Moreover, at time point t4, the delay sampling circuit 430 is activated; meanwhile, the first sampling signal S2 is enabled, and the second sampling signal S3 is also enabled. The XOR gate 440 determines the level of the data validity signal DV according to the first sampling signal S2 and the second sampling signal S3. For example, at time point t2, the first sampling signal S2 is enabled and the second sampling signal S3 is disabled, so the data validity signal DV is enabled. At time point t4, the first sampling signal S2 signal is disabled and the second sampling signal S3 is enabled, so the data validity signal DV is also enabled; meanwhile, the data validity signal DV is enabled, and this indicates that the supplementary clock signal Clk10 corresponding to the $10^{th}$ bit (the least significant bit) is enabled, that is, the 10-bit digital value is valid.

At time point t5, the supplementary clock signal Clk10 is disabled, and does not activate the divider 410. Thus, at time point t6, after the sampling circuit 420 and the delay sampling circuit 430 are activated, the sampling circuit 420 and the delay sampling circuit 430 still keep the disabled first sampling signal S2 and the disabled second sampling signal S3 along with the disabled first signal S1. Thus, at time point t6, the data validity signal DV is also disabled. This indicates that the supplementary clock signal Clk10 corresponding to the $10^{th}$ bit (the least significant bit) is disabled, and the 10-bit digital value is invalid.

Figure 6A:
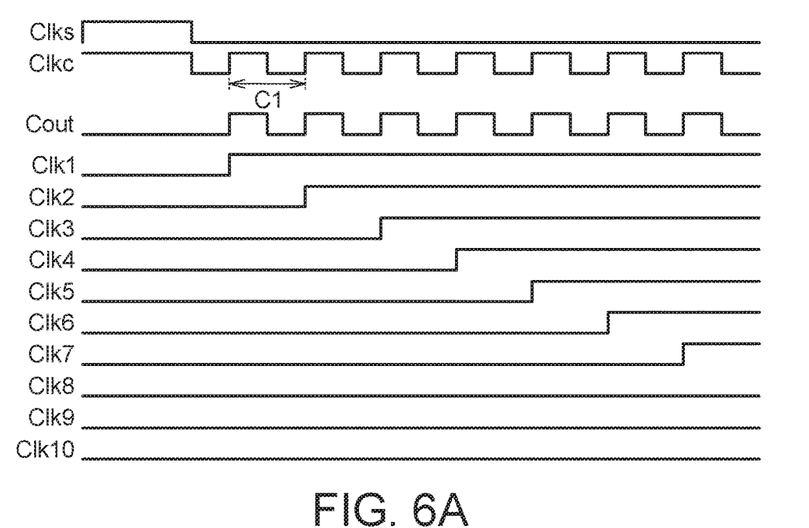
FIG. 6A and FIG. 6B are timing diagrams of the clock signal of a successive approximation ADC operated in a longer cycle and a shorter cycle, respectively.
Figure 6B:
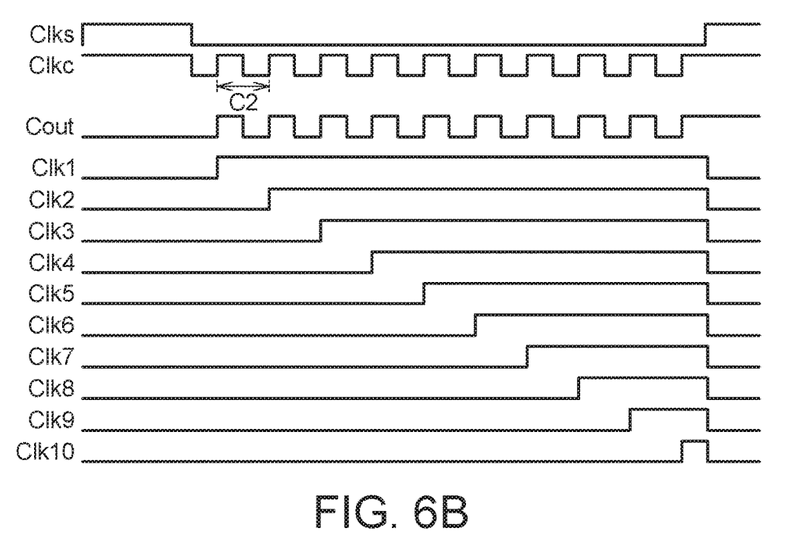

In an embodiment, a cycle of the clock signal Clkc can be adjusted according to whether the supplementary clock signal of the least significant bit is enabled. FIG. 6A and FIG. 6B are timing diagrams of the clock signal Clkc of a successive approximation ADC operated in a longer cycle and a shorter cycle, respectively. For example, the cycle of the clock signal Clkc can be selectively increased when the data validity signal DV indicates that the supplementary clock signal Clk10 corresponding to the $10^{th}$ bit (the least significant bit) is enabled, and can be selectively decreased when the data validity signal DV indicates that the supplementary clock signal Clk10 corresponding to the $10^{th}$ bit (the least significant bit) is disabled. Thus, by adjusting the cycle of the clock signal Clkc, the comparison time will be sufficient for generating the value of each bit, and a valid digital value can be generated. As indicated in FIG. 6A, the cycle of the clock signal Clkc is C1, and the supplementary clock signal Clk10 corresponding to the $10^{th}$ bit (the least significant bit) is disabled. This indicates that the 10-bit digital value is invalid. Therefore, the cycle of the clock signal Clkc can be selectively decreased until the supplementary clock signal Clk10 is enabled. As indicated in FIG. 6B, the supplementary clock signal Clk10 corresponding to the $10^{th}$ bit (the least significant bit) is enabled, and the cycle of the clock signal Clkc is C2, which is shorter than C1.

In another embodiment, the resolution level of the successive approximation ADC can be reduced by adjusting the cycle of the clock signal Clkc. For example, although the successive approximation ADC 100 can be converted into a 10-bit digital value, and the digital value required in the present embodiment has 7 bits only. Therefore, the least significant bit is set as the $7^{th}$ bit, and whether the 7-bit digital value is valid can be determined by detecting whether the supplementary clock signal Clk7 corresponding to the $7^{th}$ bit is enabled. Thus, the cycle C2 of the clock signal Clkc of FIG. 6B can be prolonged to the cycle C1 of the clock signal Clkc of FIG. 6A, and the supplementary clock signal Clk7 corresponding to the $7^{th}$ bit is enabled. In the present embodiment, the cycle of the clock signal Clkc is prolonged by reducing the resolution level, such that the operating frequency of the successive approximation ADC can be decreased, and power consumption can be saved.

Figure 7:
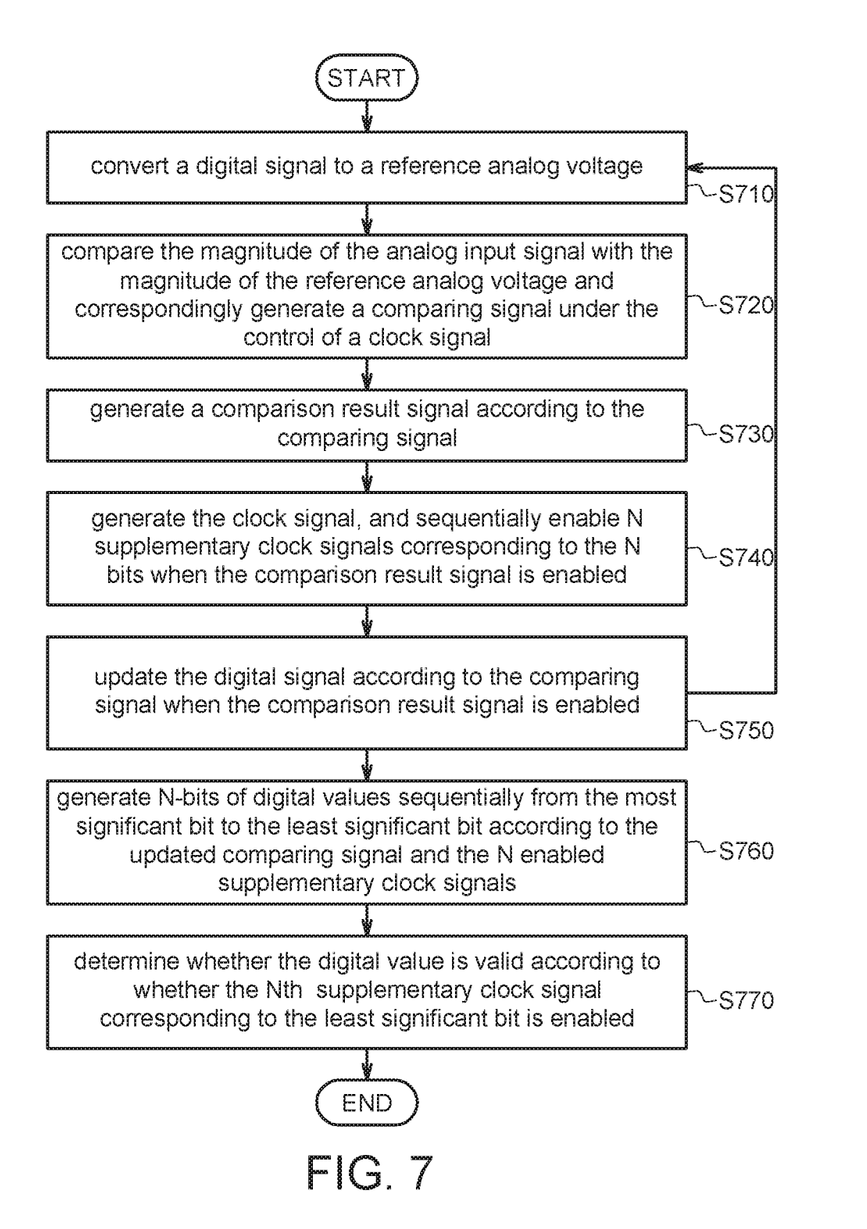
FIG. 7 is a flowchart of a control method of successive approximation ADC.

According to the above descriptions, the present disclosure provides a control method of successive approximation ADC. FIG. 7 is a flowchart of a control method of successive approximation ADC. The successive approximation ADC, such as the successive approximation ADC 100 of FIG. 1 converts an analog input signal into an N-bit digital value, wherein N is an integer greater than 1. The control method includes following steps. Firstly, the method begins at step S710, a digital signal is converted to a reference analog voltage. Next, the method proceeds to step S720, under the control of a clock signal, the magnitude of the analog input signal is compared with the magnitude of the reference analog voltage and a comparing signal is correspondingly generated. Then, the method proceeds to step S730, a comparison result signal is generated according to the comparing signal, and is enabled when the comparator completes comparison. Then, the method proceeds to step S740, a clock signal is generated, and N supplementary clock signals corresponding to the N bits are enabled sequentially when the comparison result signal is enabled. Then, the method proceeds to step S750, the digital signal is updated according to the comparing signal when the comparison result signal is enabled. After the digital signal is updated in step S750, the method repeats steps S710-S750 in which the comparing signal is correspondingly updated by the comparator and the comparison result signal is correspondingly updated according to the updated comparing signal repetitively to sequentially enable the N supplementary clock signals. Following steps S710-S750, the method proceeds to step S760, a N-bit digital value is generated sequentially from the most significant bit to the least significant bit according to the updated comparing signal and the N enabled supplementary clock signals. Lastly, the method proceeds to step S770, whether the digital value is valid is determined according to whether the $N^{th}$ supplementary clock signal corresponding to the least significant bit is enabled.

According to the above embodiments, a number of successive approximation ADCs and a control method thereof are provided. The validity of the digital value converted by the successive approximation ADC is determined according to whether the $N^{th}$ supplementary clock signal corresponding to the least significant bit is enabled. Moreover, by adjusting the cycle of the clock signal according to whether the $N^{th}$ supplementary clock signal corresponding to the least significant bit is enabled, the comparison time will be sufficient for generating the value of each bit, and a valid digital value can be generated. Therefore, the accuracy of the digital value converted by the successive approximation ADC can be increased.

Alternatively, the resolution level of the successive approximation ADC can be reduced by adjusting the cycle of the clock signal according to whether one bit of the digital value corresponding to the supplementary clock signal is enabled, such that the operating frequency of the successive approximation ADC can be decreased, and power consumption can be saved.

It will be apparent to those skilled in the art that various modifications and variations can be made to the disclosed embodiments. It is intended that the specification and examples be considered as exemplary only, with a true scope of the present disclosure being indicated by the following claims and their equivalents.

What is claimed is:

1. A successive approximation ADC for converting an analog input signal to an N-bit digital value, wherein N is a positive integer greater than 1, and the successive approximation ADC comprises:
   a digital-to-analog converter for converting a digital signal to a reference analog voltage;
   a comparator for comparing the magnitude of the analog input signal with the magnitude of the reference analog voltage and correspondingly generating a comparing signal under the control of a clock signal;
   a comparison unit for generating a comparison result signal according to the comparing signal, wherein the comparison result signal is enabled when the comparator completes comparison;
   a timing unit for generating the clock signal, and sequentially enabling N supplementary clock signals corresponding to the N bits when the comparison result signal is enabled; and
   a control logic circuit for updating the digital signal according to the comparing signal when the comparison result signal is enabled, such that the comparator correspondingly updates the comparing signal, wherein the control logic circuit further correspondingly updates the comparison result signal according to the updated comparing signal repetitively to sequentially enable the N supplementary clock signals, and the control logic circuit further generates the N-bit digital value sequentially from the most significant bit to the least significant bit according to the updated comparing signal and the N enabled supplementary clock signals, and determines whether the digital value is valid according to whether the $N^{th}$ supplementary clock signal corresponding to the least significant bit is enabled.

2. The successive approximation ADC according to claim 1, wherein the control logic circuit comprises:
   a divider for receiving the supplementary clock signal corresponding to the least significant bit and generating a first signal;
   a sampling circuit for receiving the first signal and generating a first sampling signal under the control of a sampling clock signal;
   a delay sampling circuit for receiving the first sampling signal and delaying the first sampling signal to generate a second sampling signal under the control of the sampling clock signal; and
   an XOR gate for receiving the first sampling signal and the second sampling signal to generate a data validity signal to determine whether the supplementary clock signal corresponding to the least significant bit is enabled.

3. The successive approximation ADC according to claim 2, wherein the timing unit further adjusts a cycle of the clock signal according to the data validity signal.

4. The successive approximation ADC according to claim 3, wherein the cycle of the clock signal is selectively increased when the data validity signal indicates that the supplementary clock signal corresponding to the least significant bit is enabled.

5. The successive approximation ADC according to claim 3, wherein the cycle of the clock signal is selectively decreased when the data validity signal indicates that the supplementary clock signal corresponding to the least significant bit is disabled.

6. The successive approximation ADC according to claim 1, wherein the divider, the sampling circuit, and the delay sampling circuit are realized by D-type flip-flops.

7. The successive approximation ADC according to claim 1, wherein the successive approximation ADC can selectively convert the analog input signal to an M-bit digital value, and M is a positive integer greater than N.

8. A control method of successive approximation ADC, wherein the successive approximation ADC converts an analog input signal to an N-bit digital value, N is a positive integer greater than 1, and the control method comprises:
   converting a digital signal to a reference analog voltage;
   comparing the magnitude of the analog input signal with the magnitude of the reference analog voltage and correspondingly generating a comparing signal under the control of a clock signal;
   generating a comparison result signal according to the comparing signal, wherein the comparison result signal is enabled when a comparator completes comparison;
   generating the clock signal, and sequentially enabling N supplementary clock signals corresponding to the N bits when the comparison result signal is enabled;
   updating the digital signal according to the comparing signal when the comparison result signal is enabled such that the comparator correspondingly updates the comparing signal, wherein the comparison result signal is correspondingly updated according to the updated comparing signal repetitively to sequentially enable the N supplementary clock signals;

generating the N-bit digital value sequentially from the most significant bit to the least significant bit according to the updated comparing signal and the N enabled supplementary clock signals; and determining whether the digital value is valid according to whether the $N^{th}$ supplementary clock signal corresponding to the least significant bit is enabled.

9. The control method according to claim 8, wherein the step of determining whether the digital value is valid according to whether the $N^{th}$ supplementary clock signal corresponding to the least significant bit is enabled comprises:

receiving the supplementary clock signal corresponding to the $N^{th}$ bit and generating a first signal;

receiving the first signal and generating a first sampling signal under the control of a sampling clock signal;

receiving the first sampling signal and delaying the first sampling signal to generate a second sampling signal under the control of the sampling clock signal; and receiving the first sampling signal and the second sampling signal to generate a data validity signal to determine whether the supplementary clock signal corresponding to the least significant bit is enabled.

10. The control method according to claim 9, further comprising:

adjusting a cycle of the clock signal according to the data validity signal.

11. The control method according to claim 10, further comprising:

selectively increasing the cycle of the clock signal when the data validity signal indicates that the supplementary clock signal corresponding to the least significant bit is enabled.

12. The control method according to claim 10, further comprising:

selectively decreasing the cycle of the clock signal when the data validity signal indicates that the supplementary clock signal corresponding to the least significant bit is disabled.

13. The control method according to claim 8, wherein the successive approximation ADC can selectively convert the analog input signal to an M-bit digital value, M is a positive integer greater than N.

* * * * *